(12) United States Patent
Pvss et al.

(10) Patent No.: US 9,792,395 B1
(45) Date of Patent: Oct. 17, 2017

(54) MEMORY UTILIZATION IN A CIRCUIT DESIGN

(71) Applicant: Xilinx, Inc., San Jose, CA (US)

(72) Inventors: Jayaram Pvss, Hyderabad (IN); Robert Bellarmin Susai, Hyderabad (IN); Khang K. Dao, San Jose, CA (US)

(73) Assignee: XILINX, INC., San Jose, CA (US)

( * ) Notice: Subject to any disclaimer, the term of this patent is extended or adjusted under 35 U.S.C. 154(b) by 12 days.

(21) Appl. No.: 15/013,196

(22) Filed: Feb. 2, 2016

(51) Int. Cl.
*G06F 17/50* (2006.01)

(52) U.S. Cl.
CPC .................................. *G06F 17/505* (2013.01)

(58) Field of Classification Search
CPC ............................ G06F 17/5045; G06F 17/505
USPC .................................................. 716/101, 103
See application file for complete search history.

(56) References Cited

U.S. PATENT DOCUMENTS

| | | | |
|---|---|---|---|
| 6,182,247 B1 * | 1/2001 | Herrmann et al. | G01R 31/3177 702/117 |
| 7,451,423 B1 * | 11/2008 | Reynolds et al. | G06F 17/5054 716/138 |
| 8,341,568 B2 * | 12/2012 | Chen et al. | G06F 17/5022 703/15 |
| 9,432,298 B1 * | 8/2016 | Smith | H04L 49/9057 |
| 2009/0164203 A1 * | 6/2009 | Norman | G06F 17/505 703/24 |

* cited by examiner

Primary Examiner — Sun Lin

(74) Attorney, Agent, or Firm — LeRoy D. Maunu

(57) ABSTRACT

The disclosed approaches compile a hierarchical representation of a circuit design into a flattened netlist and store the flattened netlist a memory circuit. The circuit design instantiates a plurality of memory blocks of a target device and specifies logic circuits that access the plurality of memory blocks, respectively. The flattened netlist is modified by determining a subset of the plurality of memory blocks. The quantity of memory reserved in each memory block of the subset is less than a capacity of said each memory block. One memory block is instantiated, for a pair of the memory blocks of the subset, in place of each memory block of the pair in the flattened netlist in the memory circuit. A portion of the flattened netlist that specifies the logic circuits that access each memory block of the pair is modified to access the one memory block instead of each memory block of the pair.

20 Claims, 8 Drawing Sheets

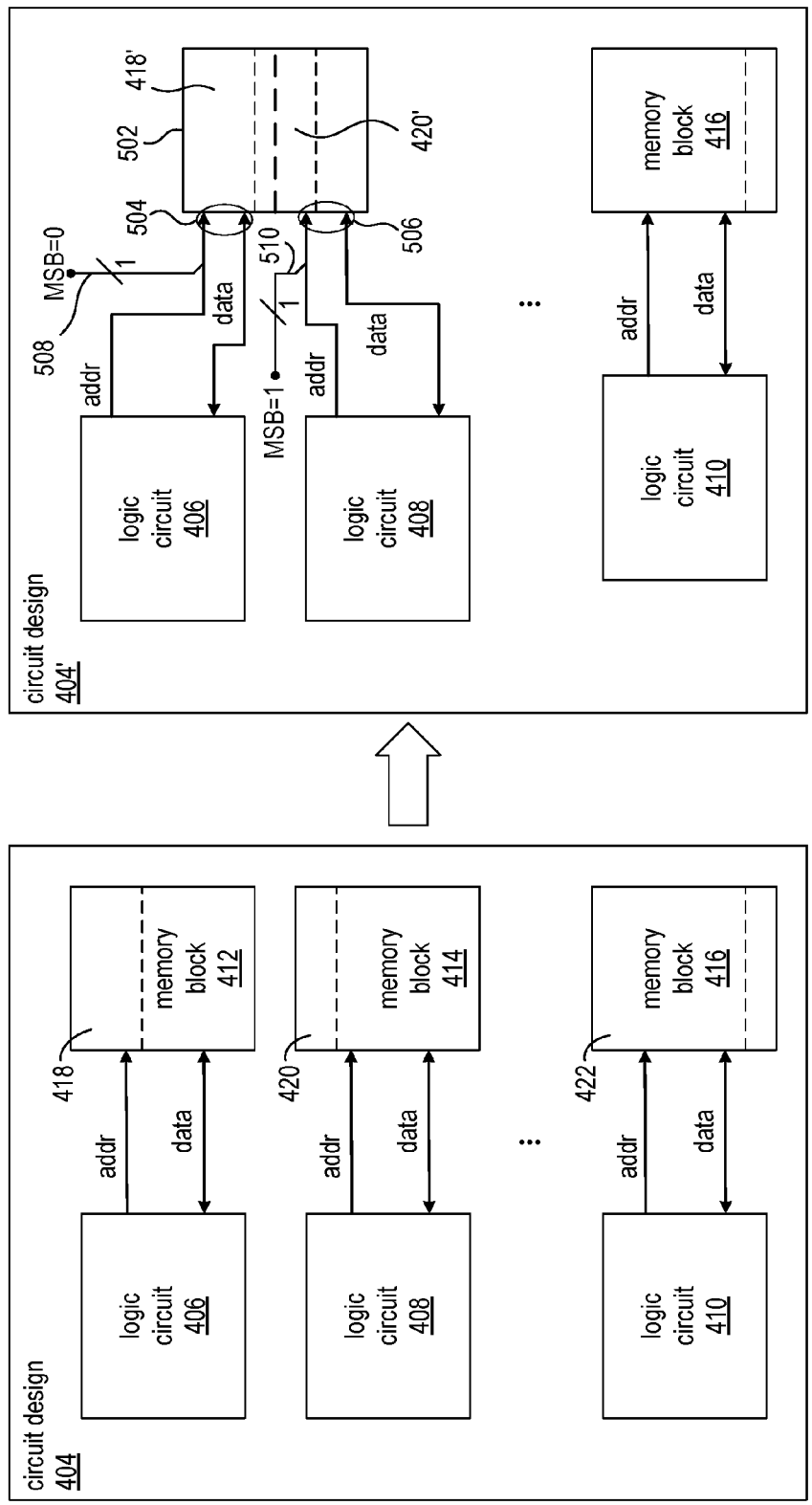

MEMORY UTILIZATION IN A CIRCUIT DESIGN

TECHNICAL FIELD

The disclosure generally relates to processing a circuit design to improve memory utilization.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

High-level circuit designs are often specified through a graphical user interface (GUI) or hardware description language (HDL) such as VHDL or Verilog. GUIs and HDLs provide a high-level of abstraction when creating a circuit design, which may simplify and expedite the design task. High-level circuit design tools aid in the development of large-scale designs. Different groups may be tasked with creating different parts of a design, and the different parts of the design may be merged at a high level and compiled.

High-level design approaches and parallel development of parts of a design may lead to a design that is inefficient and more expensive than desired. For example, different parts of the design may instantiate physically discrete, fixed size blocks of RAM that are available on the target device. However, many of the memory blocks may be only partially used by the design. That is, the target device may provide fixed-size memory blocks. Yet only a portion of each of those fixed-size memory blocks that is instantiated in the design may be used by the design. For example, a fixed-size memory block may be 1 Mbyte, and the design may need to access only 300 Kbytes of the memory block, leaving 700 Kbytes of unused memory.

Memory blocks that are partially used waste power as the static power consumption of the unused portions of the memory blocks contribute to the overall power consumption of the device even though the unused portions do not contribute to the functioning of the design. Partially used memory blocks may also increase the end-product cost. If the number of memory blocks instantiated in a design exceeds the number of memory blocks available on a single device, the design may need to be split implemented on multiple devices, which may be more expensive than a single device.

SUMMARY

In one embodiment, a method of processing a circuit design includes compiling a hierarchical representation of the circuit design into a flattened netlist by a processor circuit. The processor circuit stores the flattened netlist in a memory circuit. The circuit design instantiates a plurality of memory blocks of a target device and specifies logic circuits that access the plurality of memory blocks, respectively. The processor circuit modifies the flattened netlist by determining a subset of the plurality of memory blocks. The quantity of memory reserved in each memory block of the subset is less than a capacity of the memory block. The processor circuit instantiates one memory block, for a pair of the memory blocks of the subset, in place of each memory block of the pair in the flattened netlist in the memory arrangement. The portion of the flattened netlist that specifies the logic circuits that access each memory block of the pair is modified by the processor circuit to access the one memory block instead of each memory block of the pair.

In another embodiment, a system for processing a circuit design includes a processor circuit and a memory circuit coupled to the processor circuit. The memory circuit is configured with instructions that when executed by the processor circuit cause the processor circuit to compile a hierarchical representation of the circuit design into a flattened netlist and store the flattened netlist in the memory circuit. The circuit design instantiates a plurality of memory blocks of a target device and specifies logic circuits that access the plurality of memory blocks, respectively. The memory circuit is further configured with instructions that cause the processor circuit to modify the flattened netlist. The modifying includes determining a subset of the plurality of memory blocks. The quantity of memory reserved in each memory block of the subset is less than a capacity of the memory block. The modifying further includes instantiating one memory block, for a pair of the memory blocks of the subset, in place of each memory block of the pair in the flattened netlist in the memory arrangement. A portion of the flattened netlist that specifies the logic circuits that access each memory block of the pair, is modified to access the one memory block instead of each memory block of the pair.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings in which:

FIG. 4 shows an example of a circuit design having two memory blocks that are candidates for replacement with a single replacement memory block;

FIG. 5 shows a modified circuit design in which the separate memory blocks of the circuit design in FIG. 4 have been replaced by a single memory block;

DETAILED DESCRIPTION

Figure 2:
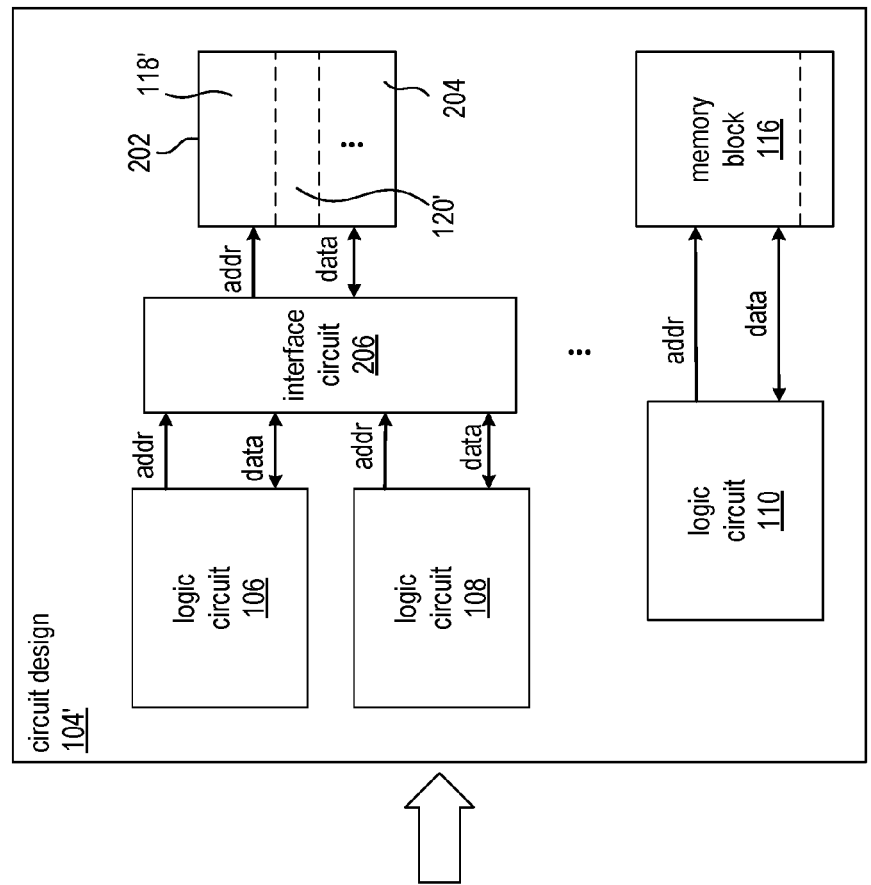
FIG. 2 shows a modified circuit design in which the separate memory blocks of the circuit design in FIG. 1 have been replaced by a single memory block.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

To improve efficiency of a circuit design, the design may be modified to replace the instantiations of two or more memory blocks that are partially used with an instantiation of a single memory block that is shared by the portions of the circuit design that accessed the two or more memory blocks. However, replacing instantiations of multiple memory blocks with a single instantiation of a memory block in a hierarchical design may be problematic. If the memory blocks that are to be replaced reside at different branches of the design hierarchy, the effort involved in moving portions of the design accessing the shared memory block to the same branch of the hierarchy may be non-trivial. In addition, modifications to the design may inadvertently introduce errors into the design.

According to the disclosed methods and systems, a hierarchical representation of a circuit design is compiled into a flattened netlist by a processor circuit, and the flattened netlist is stored in a memory circuit. The circuit design instantiates memory blocks of a target device and specifies logic circuits that access the memory blocks. Once the circuit design has been compiled into a flattened netlist, the flattened netlist may be modified to replace groups of multiple memory blocks with single memory blocks, respectively.

Each memory block for which the quantity of memory reserved for use by a portion of the design is less than the capacity of the memory block may be identified as a memory block that is a candidate for replacement. A replacement memory block may be instantiated in place of a group of candidate memory blocks if the total quantity of memory reserved for use in the group of memory blocks is less than the capacity of the replacement memory block. The replacement memory block is added to the flattened netlist, and the candidate memory blocks in the group are removed from the flattened netlist. If the flattened netlist has multiple groups of candidate memory blocks for which the total quantities of memory reserved for use is less than the capacity of a replacement memory block, the flattened netlist may be modified to include respective replacement memory blocks in place of the groups of candidate memory blocks.

The flattened netlist is further modified to connect the replacement memory blocks to the portions of the circuit design formerly connected to the groups of candidate memory blocks. In some implementations, the new connections may be made by rerouting data, address, and control signals between pins of each portion of the circuit design to a port of the replacement memory block. In other implementations, additional memory access logic circuitry may be instantiated for proper arbitration and addressing of the shared memory.

Figure 1:
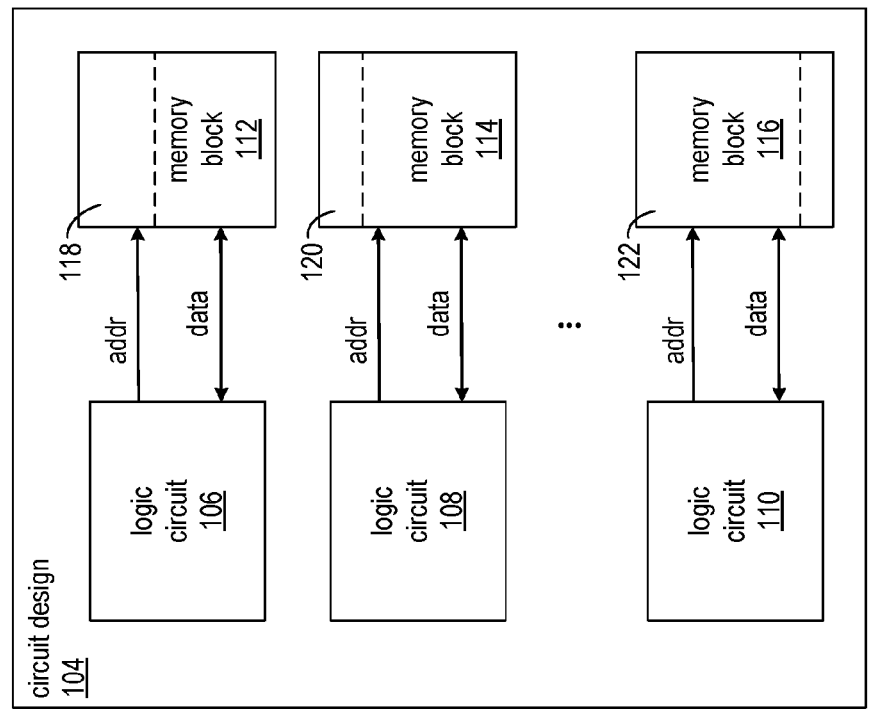
FIG. 1 shows an example of a circuit design having two memory blocks that are candidates for replacement with a single replacement memory block.

FIGS. 1 and 2 show an example in which candidate memory blocks of a circuit design are replaced with a single replacement memory block by a back-end circuit design tool. FIG. 1 shows an example of a circuit design 104 having two memory blocks that are candidates for replacement with a single replacement memory block. The circuit design may be a flattened netlist that is represented with data stored in a memory of a computer system. Portions of the circuit design that access the different memory blocks are shown as logic circuits 106, 108, and 110. The logic circuits 106, 108, and 110 are connected to memory blocks 112, 114, and 116, respectively, by address and data signal lines.

The dashed lines in the memory blocks separate portions of the address space of the memory blocks that are reserved for use by the logic circuits from unused portions of the memory blocks. The portion of the memory block above the dashed line is reserved for use by the connected logic circuit, and the portion of the memory block below the dashed line is unused. Portion 118 of memory block 112 is reserved for logic circuit 106, portion 120 of memory block 114 is reserved for logic circuit 108, and portion 122 or memory block 116 is reserved for logic circuit 110. The portion of address space reserved for use in each of the memory blocks may be specified in the flattened netlist by data associated with the logic circuits and/or the memory blocks.

The quantity of address space reserved for use in a memory block may be used in determining whether or not a memory block is a candidate for replacement. For example, in one implementation memory blocks for which a portion of the address space up to a threshold is reserved for use may be considered as candidates for replacement. In the example of FIGS. 1 and 2, memory blocks 112 and 114 are memory blocks, and memory block 116 may be excluded as a candidate memory block.

FIG. 2 shows a modified circuit design 104' in which the separate memory blocks 112 and 114 of circuit design 104 in FIG. 1 have been replaced by a single memory block 202. In the example, the memory blocks 112 and 114 have been replaced by memory block 202. Address space 118' of the memory block 202 may be assigned to logic circuit 106, and address space 120' may be assigned to logic circuit 108. Additional address space 204 may be assigned to other logic circuits for which additional memory blocks (not shown) of circuit design 104 (FIG. 1) have been replaced by memory block 202. The replacement memory block 202 may be disposed on the same IC die as the logic circuits 106 and 108 or on a separate IC die. Logic circuit 110 and memory block 116 in circuit design 104' remain unchanged from circuit design 104.

Interface circuit 206 is generated by the back-end circuit design tool and included in the circuit design 104' to provide access for logic circuit 106 and 108 to the memory block 202. The interface circuit may implement rerouted address and data signal lines, address mapping, or time division multiplexing circuits depending on the aspects of the candidate memory blocks and the replacement memory block.

Figure 3:
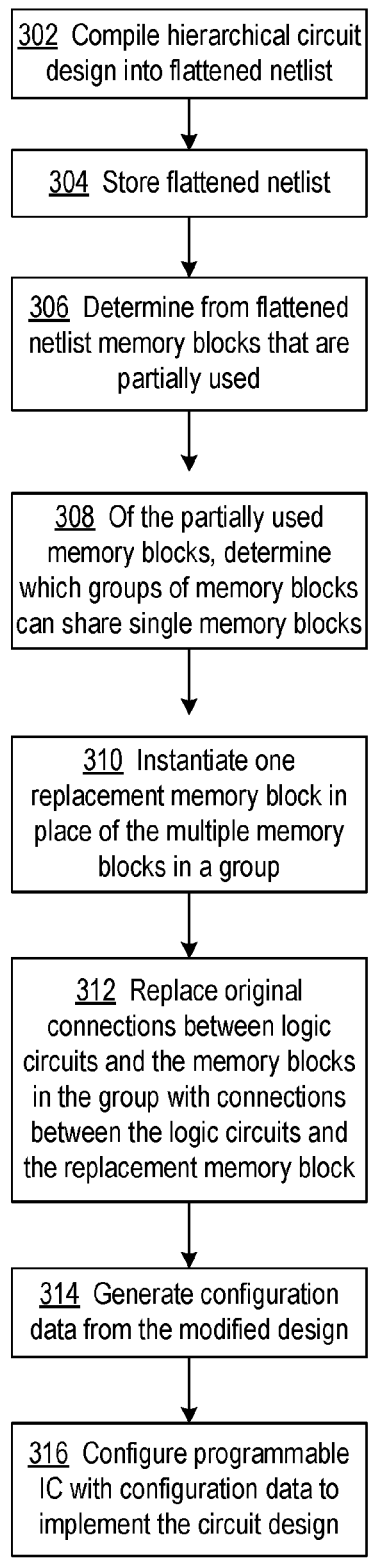
FIG. 3 shows a flowchart of a process of replacing a group of partially used memory blocks instantiated in a circuit design with a single shared memory block.

FIG. 3 shows a flowchart of a process of replacing a group of partially used memory blocks instantiated in a circuit design with a single shared memory block. At block 302, a hierarchical circuit design is compiled into a flattened netlist by a processor circuit. The hierarchical circuit design may be specified in an HDL, a GUI representation, a high-level programming language or a combination thereof, and conventional circuit design tools may be employed to compile the circuit design into a flattened netlist. The flattened netlist does not retain information that describes the hierarchical relationships between modules and submodules of the design. The flattened netlist includes unique identifiers of physical or logic circuit elements that implement the circuit design, and specifies pins of the circuit elements and connections between the pins. For circuit elements such as memory blocks, the flattened netlist may also specify the size (storage capacity) of each memory block and the quantity or address space of the memory block reserved for use by the circuit design. At block 304, the flattened netlist may be stored in a memory circuit that is coupled to the processor circuit.

At block 306, the processor circuit determines from the flattened netlist which memory blocks are partially used. That is, each memory block of a subset of the memory blocks of the circuit design may have a greater capacity than the quantity of memory reserved by the circuit design. Each memory block in the subset may be a candidate memory block that, along with one or more other candidate memory blocks in the subset, may be replaced by a single memory block. In some embodiments, a threshold value may be used to limit which partially used memory blocks are candidate memory blocks. If the quantity of memory reserved in a memory block is less than the capacity of the memory block but greater than the threshold value, the memory block may be excluded from consideration as a candidate memory block. For example, if the quantity of reserved address space is greater than a chosen percentage of the total address space of the memory block, the memory block may be excluded. If a memory block has too little unreserved memory space, the potential improvement in efficiency may be too small to merit replacement.

At block 308, the processor circuit determines which groups of two or more candidate memory blocks in the subset can be replaced with a respective, single memory block. A group of candidate memory blocks may be suitable for replacement by a single memory block if the total quantity of memory reserved for use in the group of candidate memory blocks is less than the capacity of the replacement memory block. In one implementation, a pair of candidate memory blocks may be replaced by a single memory block having the same capacity as each of the candidate memory blocks if less than half of the address space of each of the candidate memory blocks is reserved for use by the circuit design. In another implementation, two or more candidate memory blocks may be replaced with a single replacement memory block if the total quantity of memory reserved for use in the group of candidate memory blocks is less than the capacity of the replacement memory block.

At block 310, one replacement memory block is instantiated for a group of candidate memory blocks, and the group of candidate memory blocks is removed from the flattened netlist. For each group of candidate memory blocks that can share a single memory block, a respective replacement memory block may be instantiated in the flattened netlist. For target devices having different sizes of memory blocks, the replacement memory block may be the same size as the candidate memory blocks of a group or larger than the candidate memory blocks. The replacement memory block may be a memory circuit that is disposed on the same IC die as the candidate memory blocks or on an IC die other than the IC die on which the candidate memory blocks are disposed.

The flattened netlist of the circuit design is modified at block 312 by removing the connections to the candidate memory blocks in the group and creating connections between the replacement memory block and the portions of the circuit design that were formerly connected to the candidate memory blocks. In one example, if each of the candidate memory blocks is a single port memory, the replacement memory block may be a dual port memory having the lower half of address space of the replacement memory block assigned to replace one of the candidate memory blocks of the pair, and the upper half of address space of the replacement memory block assigned to replace the other one of the candidate memory blocks of the pair. The pin of the first port assigned to the most significant address bit may be tied to a constant logic 0, and the pin of the second port assigned to the most significant address bit may be tied to a constant logic 1, with other address pins of the ports connected to the portions of the circuit design formerly connected to the candidate memory blocks. In another example, if the candidate memory blocks are dual port memory blocks, time division multiplexing circuitry may be added to the flattened netlist to connect a dual port replacement memory block to the portions of the circuit design formerly connected to the candidate memory blocks.

In another example, more than two candidate memory blocks may be replaced with a single memory block if the total quantity of memory reserved in the candidate memory blocks is less than the capacity of the replacement memory block. If more than two candidate memory blocks are replaced or if the address space of the replacement memory block is not divided equally between two candidate memory blocks, address mapping circuitry may be added to the flattened netlist to map addresses of the candidate memory blocks referenced by portions of the circuit design to addresses in the replacement memory block.

If the replacement memory block is disposed on an IC die other than the IC die on which the portions of the circuit design that access the replacement memory block are disposed, the flattened netlist may be modified with a specification of additional interface circuitry to access the off-chip memory.

At block 314, configuration data is generated from the flattened netlist. For example, place-and-route and bitstream generation tools may be executed to generate configuration data for an FPGA. At block 316, a programmable IC may be configured with the configuration data, thereby creating a circuit that operates according to the circuit design as modified to include replacement memory blocks in place of groups of candidate memory blocks.

Figure 6:
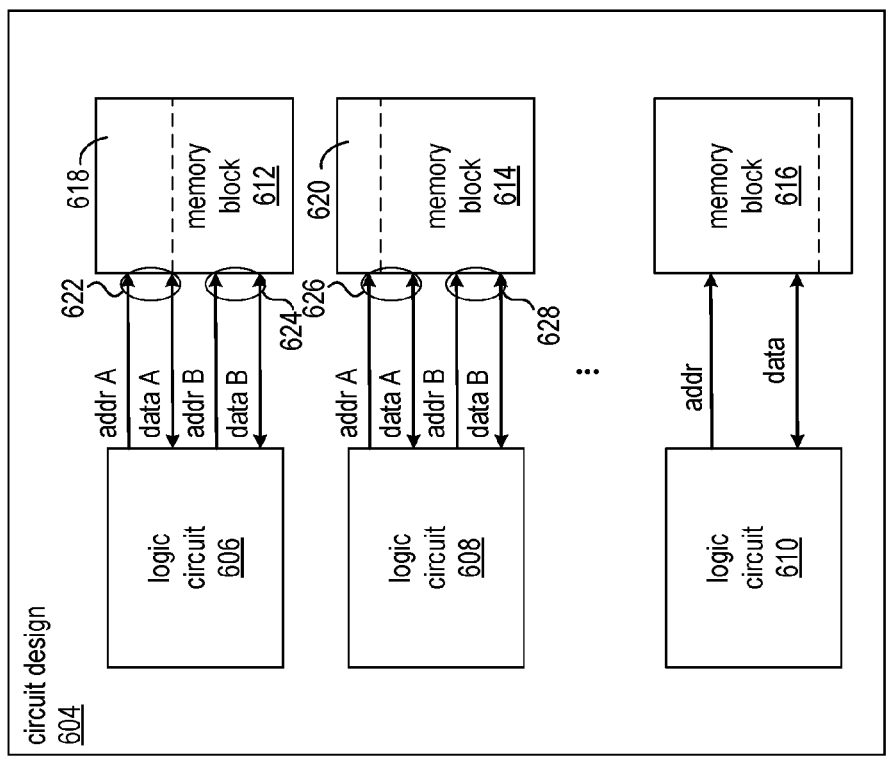
FIG. 6 shows an example of a circuit design having two dual port memory blocks that are candidates for replacement with a single replacement memory block.
Figure 7:
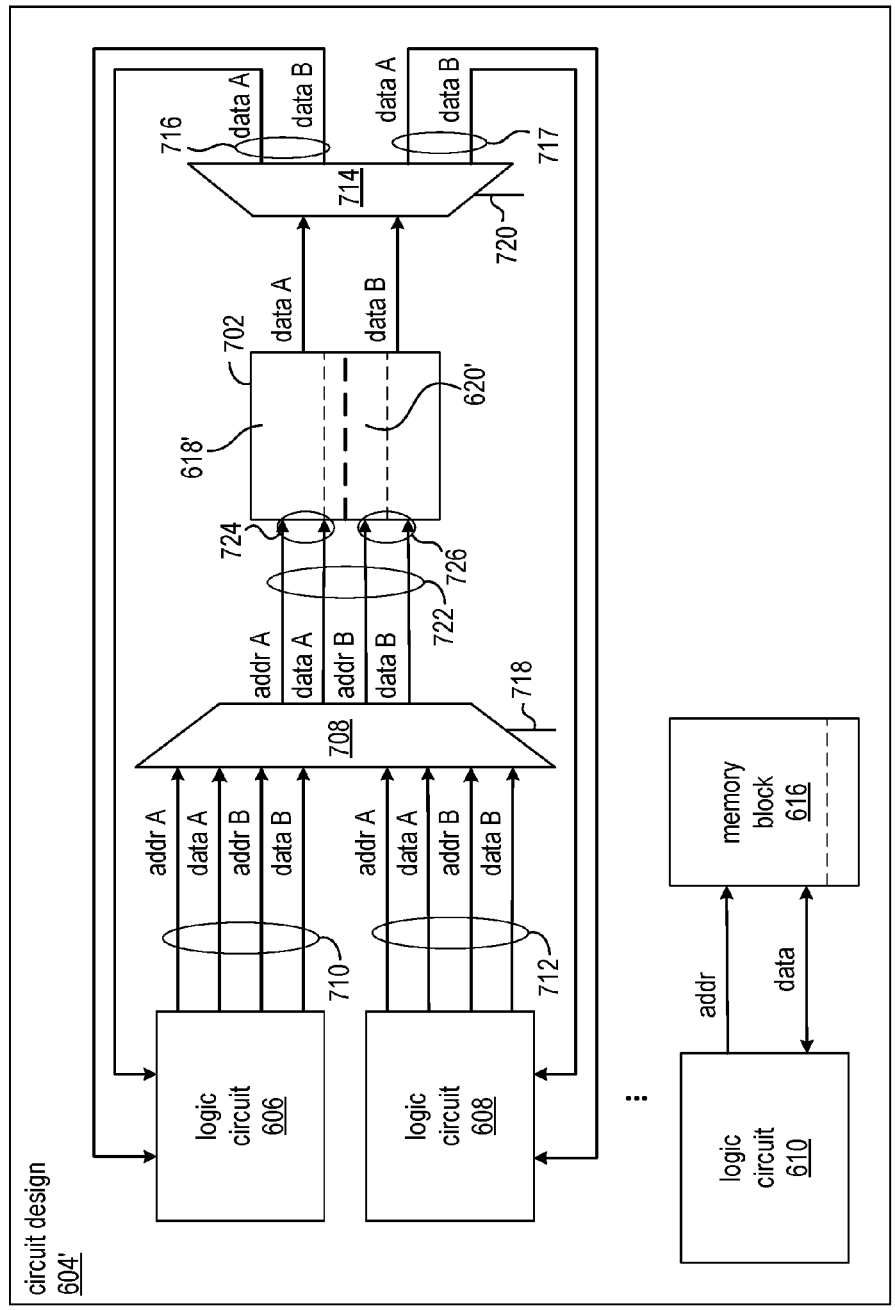
FIG. 7 shows a modified circuit design in which the separate memory blocks of the circuit design in FIG. 6 have been replaced by a single dual port memory block.

Though the example disclosed in FIGS. 4-5 involves a pair of single port candidate memory blocks replaced by one dual port memory block, and the example disclosed in FIGS. 6-7 involves a pair of dual port memory blocks replaced by one dual port memory block, those skilled in the art will recognize that the teachings here may be applied to numerous other replacement scenarios. For example, more than two single port memory blocks may be replaced by one single port memory block using time division multiplexing and address mapping as described herein. Similarly, more than two dual port memory blocks may be replaced by one dual port memory block using time division multiplexing and address mapping. In addition, a combination of single port and dual port memory blocks may be replaced by a single dual port memory block using the multiplexing disclosed herein. Address mapping circuits may be used for a combination of more than two candidate single port and dual port memory blocks.

FIGS. 4 and 5 show an example in which candidate memory blocks of a circuit design are replaced with a single replacement memory block. FIG. 4 shows an example of a circuit design 404 having two memory blocks that are candidates for replacement with a single replacement memory block. The circuit design may be a flattened netlist that is represented with data stored in a memory of a computer system. Portions of the circuit design that access the different memory blocks are shown as logic circuits 406, 408, and 410. The logic circuits 406, 408, and 410 are connected to memory blocks 412, 414, and 416, respectively, by address and data signal lines.

Each of the memory blocks 412, 414, and 416 is a single port memory block in the example. The dashed lines in the memory blocks separate portions of the address space of the memory blocks that are reserved for use by the logic circuits from unused portions of the memory blocks. The portion of the memory block above the dashed line is reserved for use by the connected logic circuit, and the portion of the memory block below the dashed line is unused. The reserved portions 418 and 420 occupy less than half the address space of memory blocks 412 and 414, respectively, and the reserved portion 422 occupies substantially more than half of the address space of the memory block 416. The portion of address space reserved for use in each of the memory blocks may be specified in the flattened netlist by data associated with the logic circuits and/or the memory blocks.

The quantity of address space reserved for use in a memory block may be used in determining whether or not a memory block is a candidate for replacement. For example, in one implementation memory blocks for which less than half the address space is reserved for use may be considered as candidates for replacement. In another implementation, memory blocks for which a portion of the address space up to a threshold (greater than half) is reserved for use may be considered as candidates for replacement. In the example of FIGS. 4 and 5, the candidate memory blocks are those for which less than half the address space is reserved for use and include memory blocks 412 and 414. Memory block 416 may be excluded as a candidate memory block based on either selection criterion.

FIG. 5 shows a modified circuit design 404' in which the separate memory blocks 412 and 414 of circuit design 404 in FIG. 4 have been replaced by a single memory block 502. In the example, the memory blocks 412 and 414 are single port memory blocks and have been replaced by dual port memory block 502. Logic circuit 406, which was connected to memory block 412 in circuit design 404, is connected to port 504 of the memory block 502 in FIG. 5. Similarly, logic circuit 408, which was connected to memory block 414, is connected to port 506 of the memory block 502. Logic circuit 410 and memory block 416 in circuit design 404' remain unchanged from circuit design 404.

The reserved address space 418 of memory block 412 is assigned to the lower half address space of memory block 502 as indicated by reference 418', and the reserved address space 420 of memory block 414 is assigned to the upper half address space of memory block 502 as indicated by reference 420'. The pin on the first port 504 for the most significant address bit is connected to constant logic 0 as shown by signal line 508, and the pin on the second port 506 for the most significant address bit is connected to constant logic 1 as shown by signal line 510.

FIGS. 6 and 7 show an example in which candidate memory blocks of a circuit design are replaced with a single replacement memory block. FIG. 6 shows an example of a circuit design 604 having two dual port memory blocks that are candidates for replacement with a single replacement memory block. The circuit design may be a flattened netlist that is represented with data stored in a memory of a computer system. Portions of the circuit design that access the different memory blocks are shown as logic circuits 606, 608, and 610. The logic circuits 606, 608, and 610 are connected to memory blocks 612, 614, and 616, respectively, by address and data signal lines.

Each of the memory blocks 612 and 614 is a dual port memory. A first set of address and data signal lines from logic circuit 606 are connected to port 622 of memory block 612, and a second set of address and data signal lines are connected to port 624 of memory block 612. A first set of address and data signal lines from logic circuit 608 are connected to port 626 of memory block 614, and a second set of address and data signal lines are connected to port 628 of memory block 614. The dashed lines in the memory blocks separate portions of the address space of the memory blocks that are reserved for use by the logic circuits from unused portions of the memory blocks. The portions 618 and 620 of the memory blocks 612 and 614 above the dashed lines are reserved for use by the connected logic circuit, and the portion of the memory blocks below the dashed lines are unused.

FIG. 7 shows a modified circuit design 604' in which the separate memory blocks 612 and 614 of circuit design 604 in FIG. 6 have been replaced by a single dual port memory block 702. In the example, the memory blocks 612 and 614 are dual port memory blocks and have been replaced by dual port memory block 702.

As the replacement memory block 702 has two ports, and a total of four ports are used by the logic circuits 606 and 608 to connect to the replaced dual port memory blocks 612 and 614, time division multiplexing circuits are included in the circuit design 604'. Multiplexer 708 switches between selection of the set 710 of address and data signal lines from logic circuit 606 and the set 712 of address and data signal lines from logic circuit 608. De-multiplexer 714 switches output of data from the memory block 702 between the data signal lines 716 to the logic circuit 606 and the data signal lines 717 to the logic circuit 608. In an example implementation, control signals 718 and 720 to the multiplexer 708 and de-multiplexer 714 may be a clock signal having a frequency that is a multiple, in this example 2, of the clock frequency at which the replaced memory blocks 612 and 614 were clocked. The replacement memory block 702 is also clocked at the multiple of the frequency of the replaced memory blocks. In an example in which n memory blocks clocked at a first clock rate are replaced with a single memory block, the replacement memory block may be clocked at n*(first clock rate), and the multiplexer 708 and de-multiplexer 714 may be switched at n*(first clock rate).

The selected set of address and data signals by multiplexer 708 are output on signal lines 722, which are connected to ports 724 and 726 of memory block 702. Address space 618 of memory block 612 is assigned to address space 618' of memory block 702, and address space 620 of memory block 614 is assigned to address space 620' of memory block 702. In this example, the reserved address space 618 of memory block 612 is assigned to the lower half address space of memory block 702 as indicated by reference 618', and the reserved address space 620 of memory block 614 is assigned to the upper half address space of memory block 702 as indicated by reference 620'. Though not shown, the pin on the first port 724 for the most significant address bit is connected to constant logic 0, and the pin on the second port 726 for the most significant address bit is connected to constant logic 1.

Figure 8:
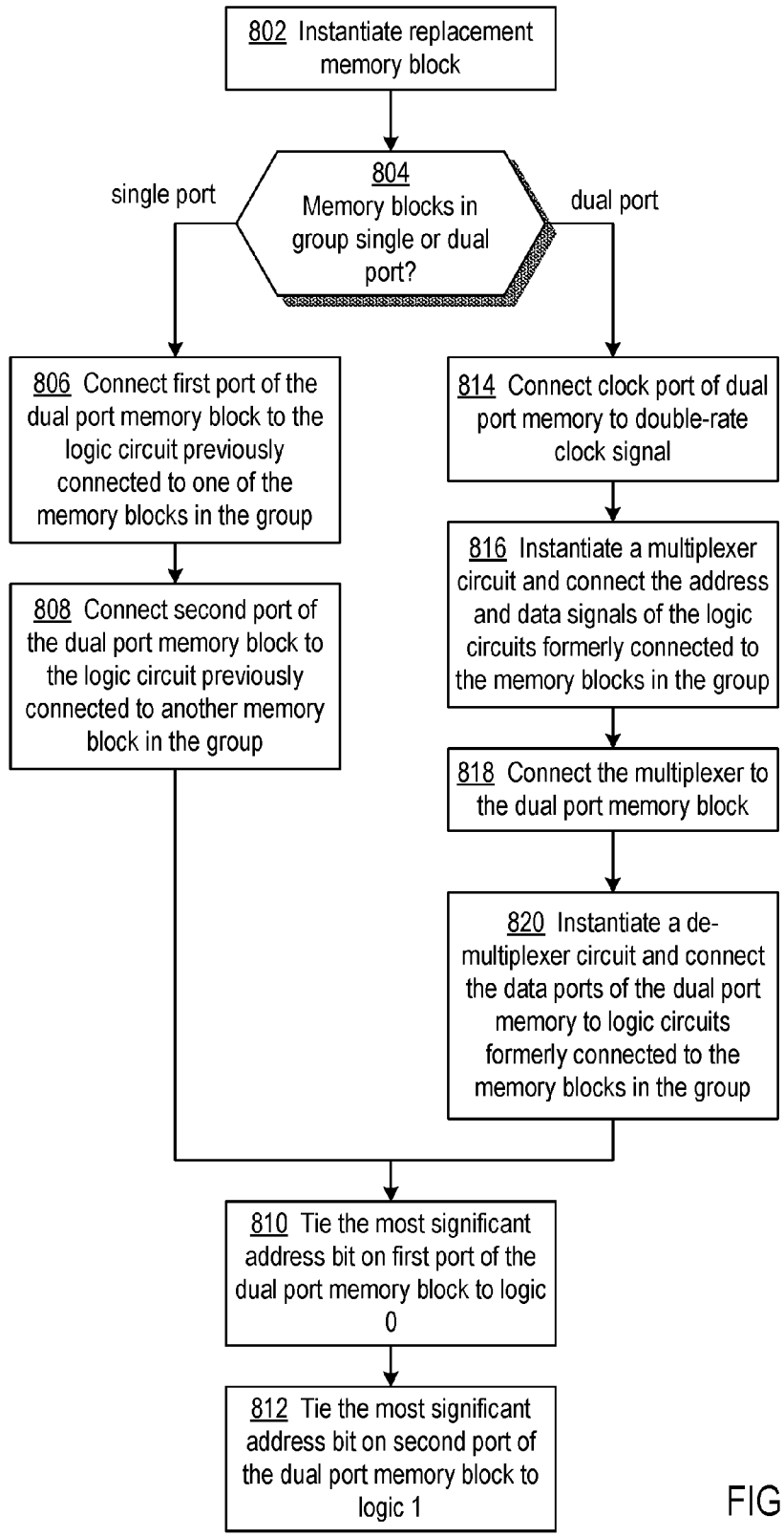
FIG. 8 shows a flowchart of a process by which a processor circuit may instantiate a replacement memory block in a flattened netlist and connect the replacement memory block to the logic circuits that were formerly connected to the replaced candidate memory blocks.

FIG. 8 shows a flowchart of a process by which a processor circuit may instantiate a replacement memory block in a flattened netlist and connect the replacement memory block to the logic circuits that were formerly connected to the replaced candidate memory blocks. Though the process of FIG. 8 involves particular examples involving two candidate memory blocks, those skilled in the art will recognize that the process may be adapted to other scenarios, such as those involving more than two candidate memory blocks or a mixture of dual port and single port candidate memory blocks.

At block 802, the replacement memory block is instantiated in the flattened netlist. At block 804, the processor circuit determines the types of candidate memory blocks. If the candidate memory blocks are single port memory blocks, the process proceeds to block 806 at which the processor circuit modifies the flattened netlist to connect a first port of the replacement memory block to the logic circuit formerly connected to one of the candidate memory blocks. At block 808, a second port of the memory block is connected to the logic circuit formerly connected to the other of the candidate memory blocks. For more than two single port candidate memory blocks, the replacement memory block may be a single port memory block, multiplexing circuitry may be instantiated to connect the logic circuits to the replacement memory block, and the replacement memory block may be clocked at a multiple of the clock rate of the replaced memory blocks, where the multiple is the number of replaced memory blocks.

At block 810, the processor circuit specifies in the flattened netlist that the pin of the most significant address bit on the first port of the replacement memory block is connected to constant logic 0, and at block 812 specifies that the pin of the most significant address bit on the second port of the replacement memory block is connected to constant logic 1. If more than two candidate memory blocks are replaced with one replacement block or if the reserved address space of one of the candidate memory blocks requires more than half the address space of the replacement memory block, the processor circuit may instantiate address mapping circuitry in the flattened netlist instead of tying pins of the most significant address bits to constant logic values 0 and 1.

If the candidate memory blocks are dual port memory blocks, the process proceeds to block 814 at which the processor circuit modifies the flattened netlist to connect a clock port of the replacement memory block to a double-rate clock signal. The double-rate clock signal is double that of clock signal to the replaced candidate memory blocks. At block 816, the processor circuit instantiates a multiplexer circuit and connects the multiplexer circuit to the logic circuits formerly connected to the replaced candidate memory blocks. The double-rate clock signal is also connected to the control pin of the multiplexer. At block 818, the output signal lines of the multiplexer are connected to the ports of the dual port memory block.

The processor circuit instantiates a de-multiplexer circuit in the flattened netlist and connects the output data pins of the replacement memory block to the input pins of the de-multiplexer circuit at block 820. In addition, processor circuit connects the output pins of the de-multiplexer circuit to the data input pins of the logic circuits formerly connected to the replaced memory blocks and connects the double-rate clock signal to the control pin of the de-multiplexer. The process continues at blocks 810 and 812 as described above.

Figure 9:
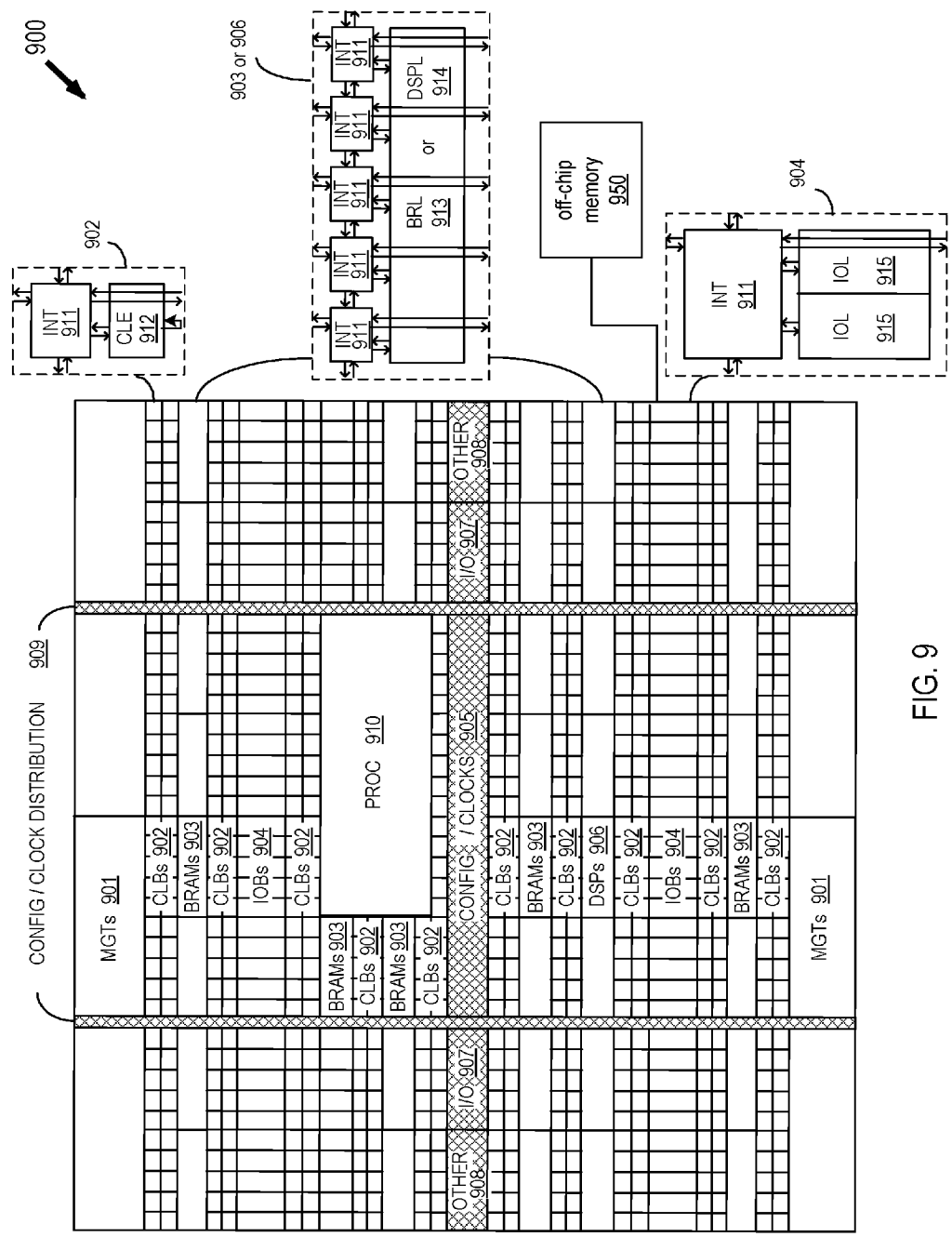
FIG. 9 shows an example of a target device for which instantiations of candidate memory blocks may be replaced by a single memory block in a flattened netlist targeted to the device.

FIG. 9 shows an example of a target device for which instantiations of candidate memory blocks may be replaced by a single memory block in a flattened netlist targeted to the device. Though a programmable IC is described, those skilled in the art will recognize that the disclosed methods and systems may be applied to circuit designs that target application specific integrated circuits (ASICs) and are not limited to programmable ICs. The programmable IC 900 may be referred to as a System On Chip (SOC) that includes field programmable gate array logic (FPGA) along with other programmable resources. FPGA logic may include several different types of programmable logic blocks in the array. For example, FIG. 9 illustrates programmable IC 900 that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, clock ports, and other programmable logic 908 such as digital clock managers, analog-to-digital converters, system monitoring logic, and so forth. Some programmable IC having FPGA logic also include dedicated processor blocks (PROC) 910 and internal and external reconfiguration ports (not shown).

The candidate and replacement memory blocks may be targeted to the BRAMs 903 of the programmable IC. In one implementation, an off-chip memory circuit 950 may be coupled to one or more IOBs 904. The off-chip memory may be disposed on an IC die that is separate from the IC die on which the programmable IC is disposed. For some scenarios, the replacement memory block may be implemented on the off-chip memory, and interface circuitry may be implemented in the CLBs 902 and IOBs 904 for connecting to the logic circuits formerly connected to the candidate memory blocks.

In some FPGA logic, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA logic. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL) 914 in addition to an appropriate number of programmable interconnect elements. An IOB 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 909 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 9 include additional logic blocks that disrupt the regular columnar structure making up a large part of the programmable IC. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual programmable IC, more than one adjacent column of CLBs is typically included wherever the CLBs appear, to facilitate the efficient implementation of user logic.

Figure 10:
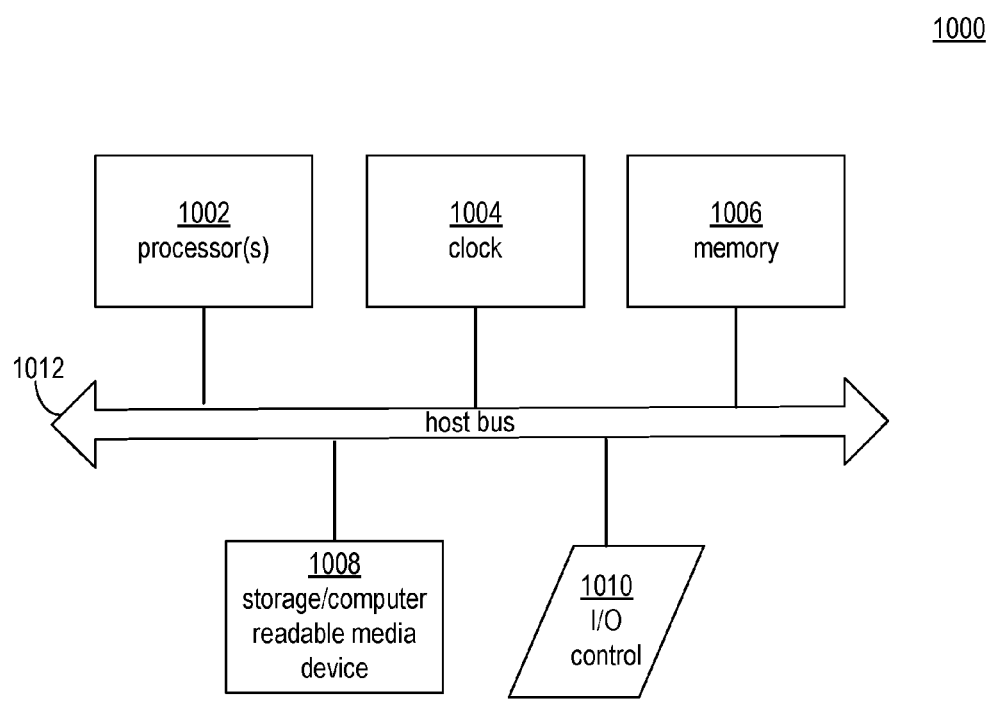
FIG. 10 shows a block diagram of an example computing arrangement that may be configured to implement the data structures and processes described herein.

FIG. 10 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Computing arrangement 1000 includes one or more processors 1002 (or "processor circuits"), a clock signal generator 1004, a memory arrangement 1006 (or "memory circuit"), a storage arrangement 1008, and an input/output control unit 1010, all coupled to a host bus 1012. The arrangement 1000 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 1002 may be one or more general purpose processors, or a combination of one or more general purpose processors and suitable co-processors, or one or more specialized processors (e.g., RISC, CISC, pipelined, etc.).

The memory arrangement 1006 typically includes multiple levels of cache memory, and a main memory. The storage arrangement 1008 may include local and/or remote persistent storage, such as provided by magnetic disks (not shown), flash, EPROM, or other non-volatile data storage. The storage unit may be read or read/write capable. Further, the memory arrangement 1006 and storage arrangement 1008 may be combined in a single arrangement.

The processor(s) 1002 executes the software in storage arrangement 1008 and/or memory arrangement 1006, reads data from and stores data to the storage arrangement 1008 and/or memory arrangement 1006, and communicates with external devices through the input/output control arrangement 1010. These functions are synchronized by the clock signal generator 1004. The resource of the computing arrangement may be managed by either an operating system (not shown), or a hardware control unit (not shown).

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for enhancing efficiency of circuit designs. Other aspects and features will be apparent to those skilled in the art from consideration of the specification. It is intended that the specification and drawings be considered as examples only, with a true scope of the invention being indicated by the following claims.

What is claimed is:

1. A method of processing a circuit design, the method comprising:
   compiling a hierarchical representation of the circuit design into a flattened netlist by a processor circuit and storing the flattened netlist in a memory circuit, wherein the circuit design instantiates a plurality of memory blocks of a target device and specifies logic circuits that access the plurality of memory blocks, respectively; and
   modifying the flattened netlist in the memory circuit by the processor circuit, the modifying including:
      determining a subset of the plurality of memory blocks, wherein a quantity of memory reserved in each memory block of the subset is less than a capacity of said each memory block;
      instantiating one memory block, for a pair of the memory blocks of the subset, in place of each memory block of the pair in the flattened netlist in the memory circuit; and
      modifying a portion of the flattened netlist, that specifies the logic circuits that access each memory block of the pair, to access said instantiated one memory block instead of each memory block of the pair.

2. The method of claim 1, wherein:
   the circuit design specifies quantities of memory reserved in the memory blocks by the logic circuits; and
   the quantity of memory reserved in each memory block of the subset is less than one-half the capacity of said each memory block.

3. The method of claim 1, wherein each memory block of the pair is a single port memory block, and the instantiating one memory block includes modifying the flattened netlist to instantiate one dual port memory block in place of the pair of memory blocks.

4. The method of claim 3, wherein the modifying a portion of the flattened netlist that specifies the logic circuits that access each memory block of the pair includes:
specifying a connection of a first logic circuit of the logic circuits to a first port of the one dual port memory block; and
specifying a connection of a second logic circuit of the logic circuits to a second port of the one dual port memory block.

5. The method of claim 1, wherein:
each memory block of the pair is a single port memory block, and the instantiating one memory block includes modifying the flattened netlist to instantiate one dual port memory block in place of the pair of single port memory blocks;
the modifying a portion of the flattened netlist that specifies the logic circuits that access each memory block of the pair includes:
specifying a connection of a first logic circuit of the logic circuits to a first port of the one dual port memory block;
specifying a fixed connection of logic 0 to a most significant address bit on the first port;
specifying a connection of a second logic circuit of the logic circuits to a second port of the one dual port memory block; and
specifying a fixed connection of logic 1 to a most significant address bit on the second port.

6. The method of claim 1, wherein:
each memory block of the pair is a dual port memory block, and the flattened netlist specifies connections between a clock port of each memory block of the pair and a first clock signal specified to operate at a first frequency;
the instantiating one memory block includes:
instantiating one dual port memory block in place of the pair of memory blocks in the flattened netlist of the circuit design in the memory circuit; and
specifying a connection of a clock port of the one dual port memory block to a second clock signal specified to operate at a second frequency that is twice the first frequency of the first clock signal;
the modifying a portion of the flattened netlist that specifies the logic circuits that access each memory block of the pair includes:
instantiating a multiplexer circuit that time division multiplexes addresses and data from the logic circuits to the one dual port memory block in response to the second clock signal;
instantiating a de-multiplexer circuit that time division de-multiplexes data from the one dual port memory block in response to the second clock signal; and
specifying address and data connections between the logic circuits and the multiplexer circuit and data connections between the logic circuits and the de-multiplexer circuit.

7. The method of claim 6, wherein the specifying address and data connections includes:
specifying a connection of a first logic circuit of the logic circuits to a first port of the one dual port memory block;
specifying a fixed connection of logic 0 to a most significant address bit on the first port;
specifying a connection of a second logic circuit of the logic circuits to a second port of the one dual port memory block; and
specifying a fixed connection of logic 1 to a most significant address bit on the second port.

8. The method of claim 1, further comprising:
generating configuration data from the flattened netlist; and
configuring a programmable integrated circuit (IC) with the configuration data to implement the circuit design on the programmable IC.

9. The method of claim 8, wherein:
the circuit design specifies quantities of memory reserved in the plurality of memory blocks by the logic circuits; and
the quantity of memory reserved in each memory block of the subset is less than one-half a capacity of said each memory block.

10. The method of claim 1, wherein:
the target device is a programmable integrated circuit (IC) disposed on a first IC die;
the one memory block is a memory block disposed on a second IC die; and
the modifying the flattened netlist that specifies the logic circuits that access each memory block of the pair includes generating a specification of an interface circuit that connects the logic circuits to pins of the first IC die assigned for accessing the one memory block.

11. A system for processing a circuit design, comprising:
a processor circuit;
a memory circuit coupled to the processor circuit and configured with instructions that, when executed by the processor circuit, cause the processor circuit to perform operations including:
compiling a hierarchical representation of the circuit design into a flattened netlist and storing the flattened netlist in the memory circuit, wherein the circuit design instantiates a plurality of memory blocks of a target device and specifies logic circuits that access the plurality of memory blocks, respectively; and
modifying the flattened netlist by a processor circuit coupled to the memory circuit, the modifying including:
determining a subset of the plurality of memory blocks, wherein a quantity of memory reserved in each memory block of the subset is less than a capacity of said each memory block;
instantiating one memory block, for a pair of the memory blocks of the subset, in place of each memory block of the pair in the flattened netlist in the memory circuit; and
modifying a portion of the flattened netlist, that specifies the logic circuits that access each memory block of the pair, to access said instantiated one memory block instead of each memory block of the pair.

12. The system of claim 11, wherein:
the circuit design specifies quantities of memory reserved in the memory blocks by the logic circuits; and
the quantity of memory reserved in each memory block of the subset is less than one-half the capacity of said each memory block.

13. The system of claim 11, wherein each memory block of the pair is a single port memory block, and the instantiating one memory block includes modifying the flattened netlist to instantiate one dual port memory block in place of the pair of memory blocks.

14. The system of claim 13, wherein the modifying a portion of the flattened netlist that specifies the logic circuits that access each memory block of the pair includes:
  specifying a connection of a first logic circuit of the logic circuits to a first port of the one dual port memory block; and
  specifying a connection of a second logic circuit of the logic circuits to a second port of the one dual port memory block.

15. The system of claim 11, wherein:
  each memory block of the pair is a single port memory block, and the instantiating one memory block includes modifying the flattened netlist to instantiate one dual port memory block in place of the pair of single port memory blocks;
  the modifying a portion of the flattened netlist that specifies the logic circuits that access each memory block of the pair includes:
    specifying a connection of a first logic circuit of the logic circuits to a first port of the one dual port memory block;
    specifying a fixed connection of logic 0 to a most significant address bit on the first port;
    specifying a connection of a second logic circuit of the logic circuits to a second port of the one dual port memory block; and
    specifying a fixed connection of logic 1 to a most significant address bit on the second port.

16. The system of claim 11, wherein:
  each memory block of the pair is a dual port memory block, and the flattened netlist specifies connections between a clock port of each memory block of the pair and a first clock signal specified to operate at a first frequency;
  the instantiating one memory block includes:
    instantiating one dual port memory block in place of the pair of memory blocks in the flattened netlist of the circuit design in the memory circuit; and
    specifying a connection of the clock port of the one dual port memory block to a second clock signal specified to operate at a second frequency that is twice the first frequency of the first clock signal;
  the modifying a portion of the flattened netlist that specifies the logic circuits that access each memory block of the pair includes:
    instantiating a multiplexer circuit that time division multiplexes addresses and data from the logic circuits to the one dual port memory block in response to the second clock signal;
    instantiating a de-multiplexer circuit that time division de-multiplexes data from the one dual port memory block in response to the second clock signal; and
    specifying address and data connections between the logic circuits and the multiplexer circuit and data connections between the logic circuits and the de-multiplexer circuit.

17. The system of claim 16, wherein the specifying address and data connections includes:
  specifying a connection of a first logic circuit of the logic circuits to a first port of the one dual port memory block;
  specifying a fixed connection of logic 0 to a most significant address bit on the first port;
  specifying a connection of a second logic circuit of the logic circuits to a second port of the one dual port memory block; and
  specifying a fixed connection of logic 1 to a most significant address bit on the second port.

18. The system of claim 11, the operations further comprising:
  generating configuration data from the flattened netlist; and
  configuring a programmable integrated circuit (IC) with the configuration data to implement the circuit design on the programmable IC.

19. The system of claim 18, wherein:
  the circuit design specifies quantities of memory reserved in the plurality of memory blocks by the logic circuits; and
  the quantity of memory reserved in each memory block of the subset is less than one-half a capacity of said each memory block.

20. The system of claim 11, wherein:
  the target device is a programmable integrated circuit (IC) disposed on a first IC die;
  the one memory block is a memory block disposed on a second IC die; and
  the modifying the flattened netlist that specifies the logic circuits that access each memory block of the pair includes generating a specification of an interface circuit that connects the logic circuits to pins of the first IC die assigned for accessing the one memory block.

* * * * *